United States Patent
Yagi et al.

(10) Patent No.: US 6,473,993 B1
(45) Date of Patent: Nov. 5, 2002

(54) THERMAL TREATMENT METHOD AND APPARATUS

(75) Inventors: Yasushi Yagi, Sagamihara (JP); Takeshi Sakuma, Yokohama (JP); Wataru Okase, Sagamihara (JP); Masayuki Kitamura, Fuchu (JP); Hironori Yagi, Yokohama (JP); Eisuke Morisaki, Sagamihara (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/537,768

(22) Filed: Mar. 30, 2000

(30) Foreign Application Priority Data

Mar. 31, 1999 (JP) .......................................... 11-092504

(51) Int. Cl.$^7$ ................................................. F26B 3/04
(52) U.S. Cl. ........................... 34/380; 432/11; 432/152; 118/715
(58) Field of Search ........................... 34/380; 432/152, 432/5, 11; 118/715, 724, 725

(56) References Cited

U.S. PATENT DOCUMENTS

| | | | |
|---|---|---|---|
| 4,980,204 A | * 12/1990 | Fujii et al. | 427/255.2 |
| 5,453,124 A | * 9/1995 | Moslehi et al. | 118/715 |
| 5,547,539 A | * 8/1996 | Arasawa et al. | 156/345 |
| 5,903,711 A | 5/1999 | Okase | |
| 5,958,140 A | 9/1999 | Arami et al. | |

FOREIGN PATENT DOCUMENTS

| | | |
|---|---|---|
| JP | 8-335575 | 12/1996 |
| JP | 9-148262 | 6/1997 |

* cited by examiner

Primary Examiner—Jiping Lu
(74) Attorney, Agent, or Firm—Smith, Gambrell & Russell, LLP

(57) ABSTRACT

A semiconductor wafer is mounted on a susceptor disposed in a processing chamber, the wafer is heated at a temperature on the order of 1000° C. for annealing, and a gas is supplied from a gas supply device disposed opposite to the wafer. When raising the temperature of the wafer and/or when lowering the temperature of the wafer, intra-surface temperature difference is limited to a small value to suppress the occurrence of slips. A gas supply device is divided into sections corresponding to a central part and a peripheral part, respectively, of the wafer to supply the gas at different flow rates onto the central part and the peripheral part, respectively. When raising the temperature of the wafer, for example, a gas of a temperature higher (lower) than that of the wafer is supplied at a flow rate per unit area greater (lower) than that at which the gas is supplied to the peripheral part to the central part. When lowering the temperature of the wafer, for example, a gas of a temperature higher (lower) than that of the wafer is supplied at a flow rate per unit area lower (higher) than that at which the gas is supplied to the peripheral part to the central part.

9 Claims, 9 Drawing Sheets

THERMAL TREATMENT METHOD AND APPARATUS

BACKGROUND OF THE INVENTION

1. Field of the Invention

The present invention relates to a thermal treatment method of thermally treating a substrate, such as a semiconductor wafer, and a thermal treatment apparatus for carrying out the same.

2. Description of the Related Art

A manufacturing processes for manufacturing semiconductor wafers (herein after referred to simply as "wafers") include an annealing process, an oxidation process and a diffusing process that are carried out in a high-temperature atmosphere in a range of 1000° C. When carrying out a thermal treatment process of this kind by a single-wafer treatment apparatus, a wafer mounted on a support table disposed in a processing chamber is heated by a heating device, such as a lamp to heat the wafer at a processing temperature, process gasses are supplied onto the surface of the wafer by a gas supply unit, such as a shower head or an injector, disposed opposite to the wafer, and the wafer is conveyed out of the processing chamber after the temperature thereof has dropped to, for example, 400° C. or below. During periods in which the temperature of the wafer rises and drops, an inert gas atmosphere is produced in the processing chamber. An inert gas is supplied into the processing chamber during an annealing process. In those processes, the inert gas is the process gas.

In a heating stage for raising the temperature of the wafer to the processing temperature, the amount of heat absorbed by unit area of the peripheral part of the wafer is greater than that of the central part of the wafer. Therefore, the temperature of the peripheral part of the wafer rises at a rate higher than that at which the temperature of the central part rises. In a cooling stage for lowering the temperature of the wafer from the processing temperature, the amount of heat radiated from unit area of the peripheral part of the wafer is greater than that radiated by the central part of the same. Therefore, the temperature of the peripheral part of the wafer drops more rapidly than that of the central par and the peripheral part of the wafer is cooled to a temperature lower than that of the central part of the same. It is possible that crystal defects called slips are produced in the wafer when intra-surface temperature difference in the surface of the wafer is large when the temperature of the wafer is higher than about 850° C. Such crystal defects reduces the yield of wafers.

Studies have been made to adjust the distribution of the heating amount of a heat source with respect to the direction along the radius of the wafer. Since there is a delay in the response of the temperature control operation, control is difficult and, if the delay is long, the control will affect the uniformity of temperature distribution in the surface of the wafer instead of improving the same.

The present invention has been made in view of the foregoing problems and it is therefore an object of the present invention to provide a thermal treatment method and a thermal treatment apparatus capable of reducing the intra-surface temperature difference in the surface of a wafer, i.e., workpiece, when raising or lowering the temperature of the wafer while thermally treating the wafer.

SUMMARY OF THE INVENTION

To achieve the object, the present invention provides a thermal treatment method comprising the steps of mounting a substrate on a substrate support mount disposed in a processing chamber; raising a temperature of the substrate; thermally treating the substrate by supplying a gas from a gas supply unit to the substrate; and lowering the temperature of the substrate after completion of thermally treating the substrate; in which the gas supplied from the gas supply unit to a peripheral part of the substrate and the gas supplied from the gas supply unit to a central part of the substrate are controlled to be different from each other in at least one of flow rate, heat capacity and temperature to compensate for the difference in temperature change rate between the peripheral part and the central part of the substrate in order that intra-surface temperature distribution of the substrate is uniform.

To achieve the object, the present invention also provides a thermal treatment apparatus comprising a processing vessel defining a processing chamber and provided with a substrate support mount disposed in the processing chamber; a heater for raising a temperature of a substrate mounted on the substrate support mount; and a gas supply system for supplying a gas onto a surface of the substrate disposed in the processing chamber to achieve the thermal treatment of the substrate; wherein the gas supply system has at least two gas supply sections for supplying gases with different properties to a peripheral part and a central part of the substrate, respectively.

The above and other objects, features and advantages of the present invention will become more apparent form the following description taken in connection with the accompanying drawings.

DESCRIPTION OF THE PREFERRED EMBODIMENTS

Figure 1:
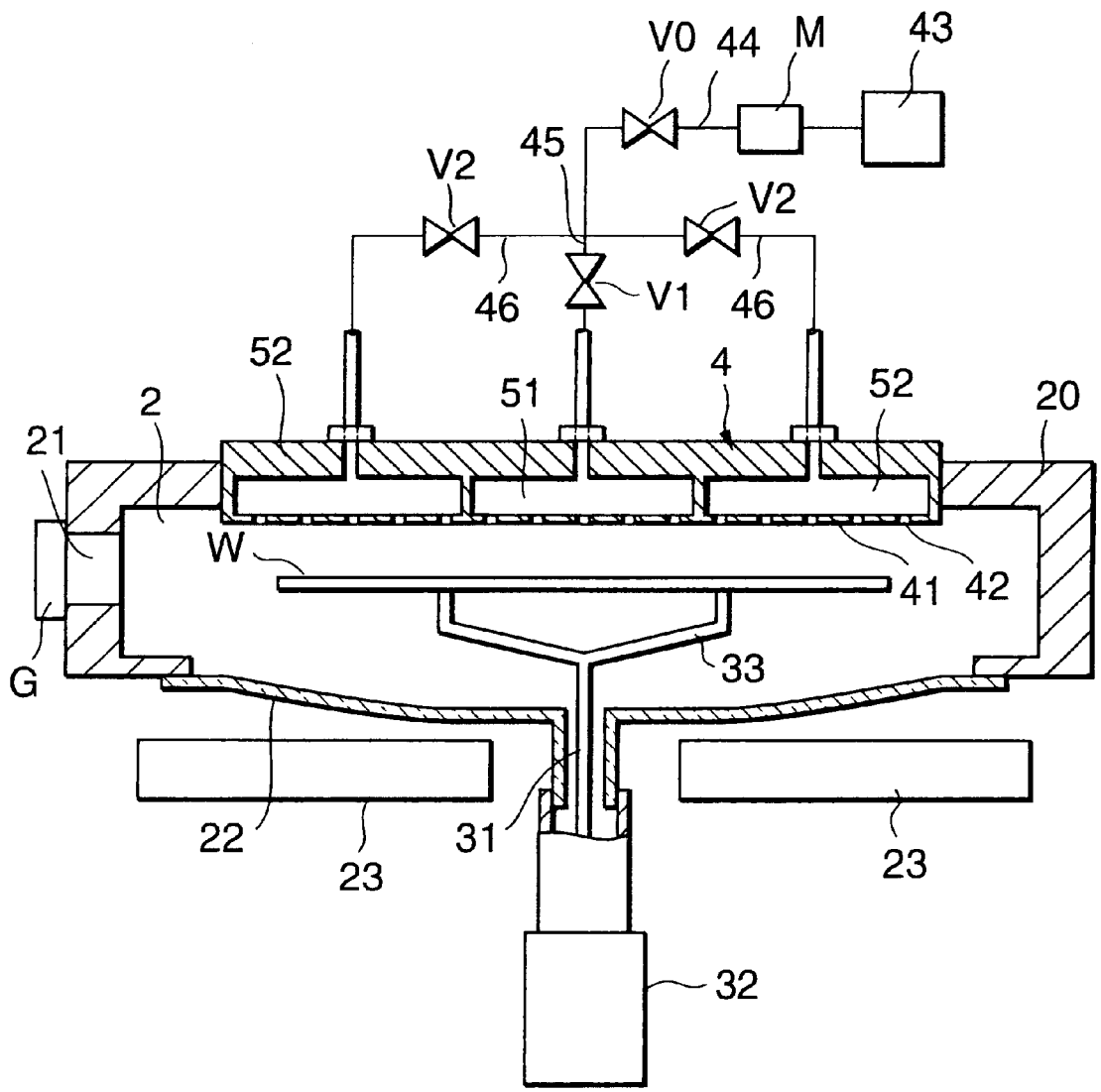
FIG. 1 is a vertical sectional view of a thermal treatment apparatus in a first embodiment of the present invention for carrying out a thermal treatment method according to the present invention.

Referring to FIG. 1, a thermal treatment apparatus in a preferred embodiment of the present invention for carrying out a thermal treatment method according to the present invention, the thermal treatment apparatus has a cylindrical vessel 20 defining a processing chamber 2, and a gate valve G is attached to the side wall of the vessel 20 so as to close a loading opening 21 through which a wafer W, i.e., a substrate, is loaded into the vessel 20. A transparent plate 22 of, for example, quartz defines the bottom of the processing chamber 2.

A shaft 31 extends vertically through the central part of the transparent plate 22. A driving unit 32 drives the shaft 31 for vertical movement and rotation about a vertical axis. A wafer mount 33 including a plurality of upright pins is attached to the upper end of the shaft 31. Lamps 23, i.e., heating means for heating the wafer W, are disposed below the transparent plate 22.

Figure 2:
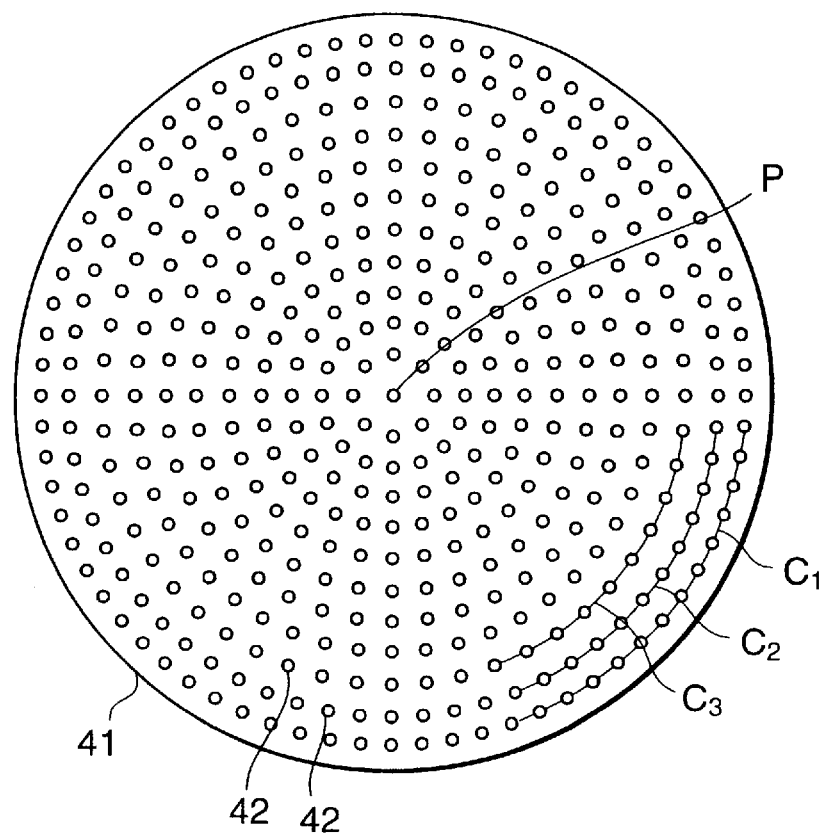
FIG. 2 is a plan view of a gas supply plate employed in the thermal treatment apparatus shown in FIG. 1.

A gas supply unit 4 is disposed opposite to the wafer W supported on the wafer mount 33 in an upper region of the processing chamber 2. A gas supply plate 41 forms the bottom wall of the gas supply unit 4 facing the wafer W. The gas supply plate 41 is provided with a plurality of gas supply holes 42 which are distributed in an area equal to or greater than that of the wafer W. The distance between the wafer W and the gas supply plate 41 is, for example, 1 mm. The gas supply holes 42 are arranged, for example, on a plurality of concentric circles having their centers at the center P of the gas supply plate 41 corresponding to the center of the wafer W, as shown in FIG. 2. The ratio of the number of the gas supply holes 42 on any one of the concentric circles to the circumference of that circle is equal to the ratio with respect to any other circles. In FIG. 2, reference characters C1, C2 and C3 denote the first, the second and the third circle from the circumference of the gas supply plate 41. When the respective circumferences of the circles C1, C2 and C3 are expressed by reference characters L1, L2 and L3, and when the respective numbers of the gas supply holes on the circles C1, C2 and C3 are expressed by n1, n2 and n3, respectively, $n1/L1 = n2/L2 = n3/L3 = C$, where C is a constant.

The interior of the gas supply unit 4 is divided radially into a plurality of gas chambers, for example, into two. In this embodiment, the interior of the gas supply unit 4 is divided radially into a first gas chamber 51 and a second annular gas chamber 52. When the thermal treatment apparatus is intended for processing, for example, 8 in. diameter wafers, the first gas chamber 51 corresponds to the gas supply holes 42 within a 5 cm radius circle having its center at the center P of the gas supply plate 41, and the second gas chamber 52 corresponds to the gas supply holes 42 arranged outside the 5 cm radius circle. In FIG. 1, indicated at 43 is a gas source. The gas source 43 supplies a gas through a gas supply pipe 44 and branch pipes 45 and 46 into the gas chambers 51 and 52. Reference characters V0, V1 and V2 denote valves, and a reference character M denotes a flow regulator placed in the gas supply pipe 44.

A thermal treatment process to be carried out by this thermal treatment apparatus to thermally treat a wafer W will be described with reference to FIGS. 3 and 4A to 4C. A wafer W, i.e., a substrate, is carried through the loading opening 21 into the processing chamber 2 by a conveyor arm, not shown, at time $t_0$. The wafer W is heated by the lamp 23 to a set temperature of, for example, 1000° C. at a mean heating rate of, for example, 100° C./s. The wafer W is held at the set temperature of 1000° C. from time $t_1$ to time $t_2$ for annealing. Then, the lamp 23 is disconnected from the power source to lower the temperature of the wafer W to, for example, a temperature of 400° C. or below from the time $t_2$ to time $t_3$, and then the wafer W is carried out of the vessel 20.

Figure 4A:
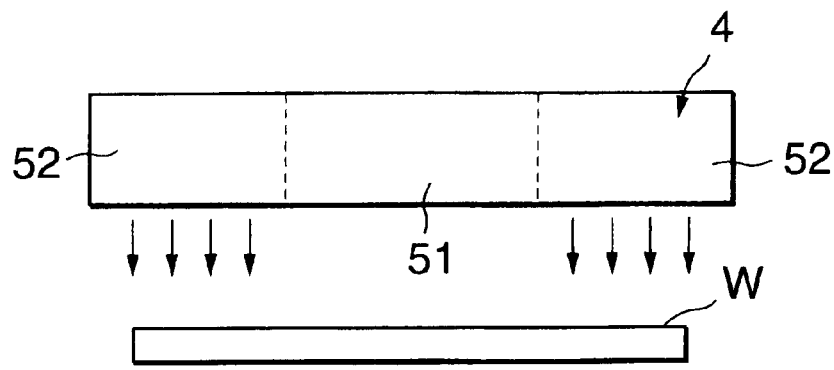
FIGS. 4A to 4C are views of assistance for explaining the relation between the temperature of a wafer and gas supply sections.

During a series of those processes, a gas is supplied by the gas supply unit 4. In the period between the times $t_0$ and $t_1$, the valves V0 and V2 are kept open and the valve V1 is kept closed to supply an inert gas, such as nitrogen gas ($N_2$) through the second gas chamber 52 and the gas supply holes 42 onto the wafer W at a flow speed of 40 cm/s. Since nitrogen gas of an ordinary temperature is supplied to the gas supply unit 4, the temperature of the nitrogen gas blown through the gas supply holes 42 on the surface of the wafer W is lower than that of the wafer W. Thus, the nitrogen gas is supplied to a peripheral part of the wafer W and is not supplied to the central part of the wafer W as shown in FIG. 4A.

Figure 4B:
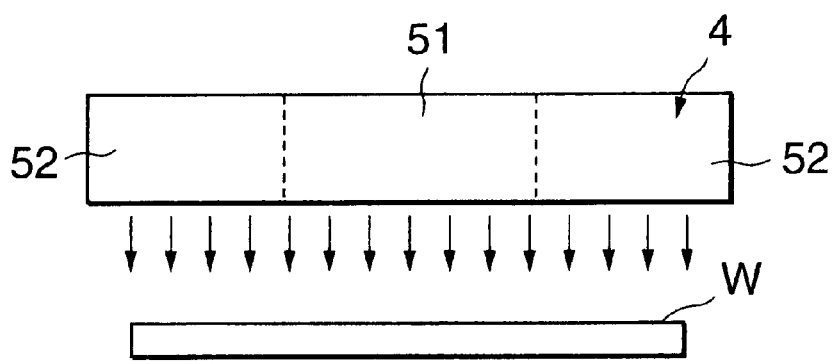
Figure 4C:
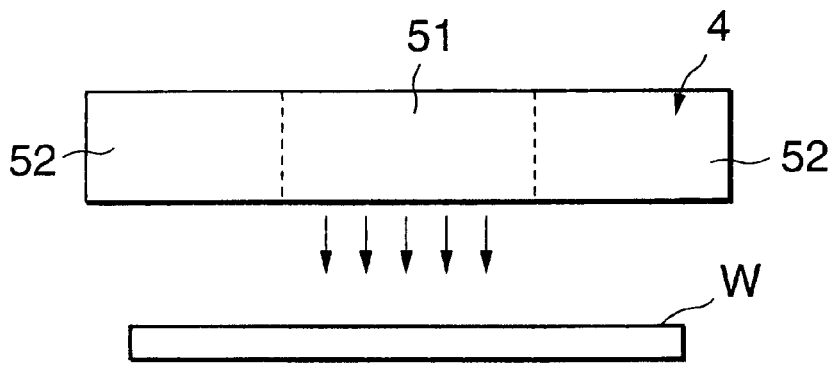

In the period between the times $t_1$, and $t_2$, the valve V1 is opened to supply nitrogen gas through the gas chamber 51 and the gas supply holes 42 also to the central part of the wafer W; that is the nitrogen gas is supplied onto the entire surface of the wafer W as shown in FIG. 4B at a flow speed of, for example, 40 cm/s. In the period between the times $t_2$ and $t_3$, the valves V2 are closed to supply the nitrogen gas through the gas chamber 51 only to the central part of the wafer W as shown in FIG. 4C at a flow speed of, for example, 40 cm/s and the nitrogen gas is not supplied to the peripheral part of the wafer W.

Figure 5A:
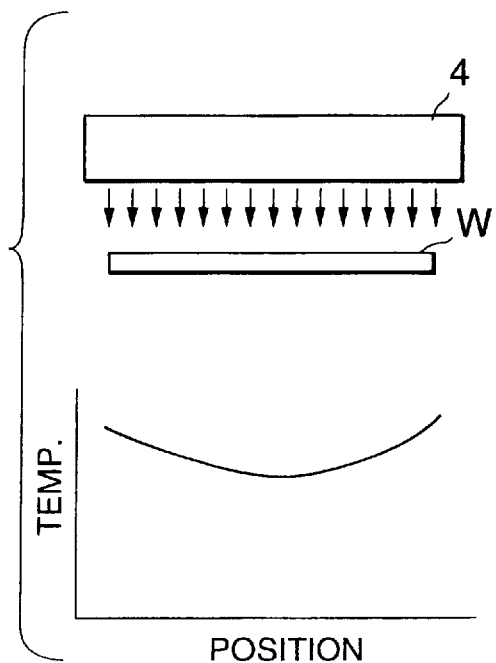
FIGS. 5A and 5B are views explaining the effect of supplying a cool gas to the peripheral part of a wafer when raising the temperature of the wafer.
Figure 5B:
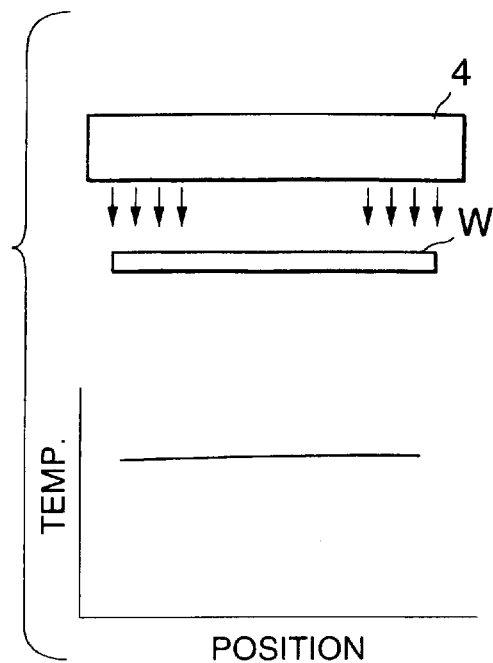

Thus, the thermal treatment apparatus improves the uniformity of temperature distribution in the surface of the wafer W both during a temperature rising period and during a temperature falling period. FIG. 5A is a graph schematically showing an intra-surface temperature distribution on the wafer W when nitrogen gas of a temperature lower than that of the wafer W, i.e., a cool gas, is supplied onto the entire surface of the wafer W during the temperature rising period. As mentioned previously, the temperature of the peripheral part of the wafer W is higher than that of the central part of the same. When the cool gas is supplied onto the peripheral part of the wafer W as mentioned above, the cool gas absorbs heat from the peripheral part of the wafer W to retard the heating of the peripheral part. Consequently, a uniform intra-surface temperature distribution as shown in FIG. 5B is obtained.

Figure 6A:
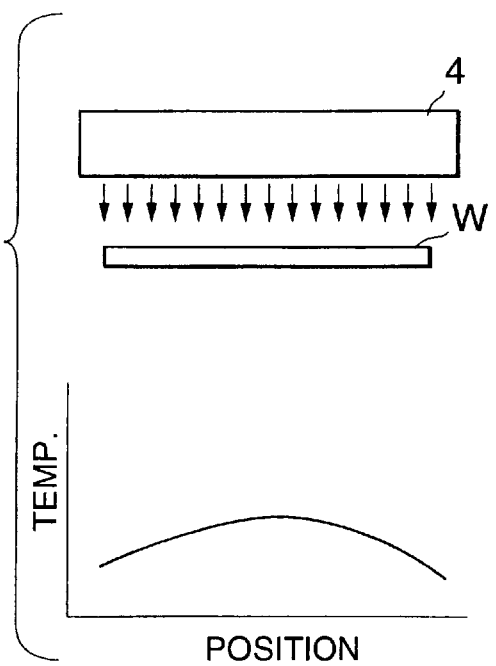
FIGS. 6A and 6B are views explaining the effect of supplying a cool gas to the central part of a wafer when lowering the temperature of the wafer.
Figure 6B:
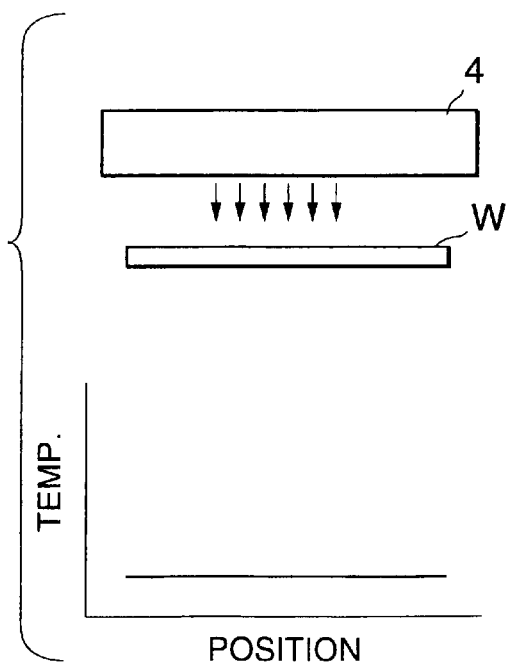

FIG. 6A is a graph schematically showing an intra-surface temperature distribution on the wafer W when nitrogen gas of a temperature lower than that of the wafer W, i.e., a cool gas, is supplied onto the entire surface of the wafer W during a temperature falling period. As mentioned previously, the temperature of the peripheral part of the wafer W is lower than that of the central part of the same. When the cool gas is supplied onto the central part of the wafer W as mentioned above, the cool gas absorbs heat from the central part of the wafer W to retard the cooling of the central part. Consequently, a uniform intra-surface temperature distribution as shown in FIG. 6B is obtained.

Thus, the occurrence of slips can be prevented because the thermal treatment apparatus in this embodiment compensates for the difference in temperature change rate between the peripheral part and the central part of the wafer in order that temperature distribution in the surface of the substrate is uniform. A temperature regulating unit, not shown, may be placed in the gas supply pipe 44 to regulate the temperature of the nitrogen gas when supplying the nitrogen gas to the gas supply unit 4.

When heating the wafer W, the nitrogen gas may be supplied also to the central part of the wafer W at a flow rate per unit area smaller than that at which the nitrogen gas is supplied to the peripheral part of the wafer W. When cooling the wafer W, the nitrogen gas may be supplied also to the peripheral part of the wafer W at a flow rate per unit area smaller than that at which the nitrogen gas is supplied to the central part of the wafer W. In the foregoing embodiment, the gas is supplied to the central part or the peripheral part at a flow rate equal to zero as an extreme example of the method of supplying the gas to the central part and the peripheral part at different flow rates per unit area, respectively; that is, when the gas is supplied to the central part (the peripheral part) at a high flow rate and the same is supplied to the peripheral part (the central part) at a low flow rate, the low flow rate may be a zero.

Figure 7:
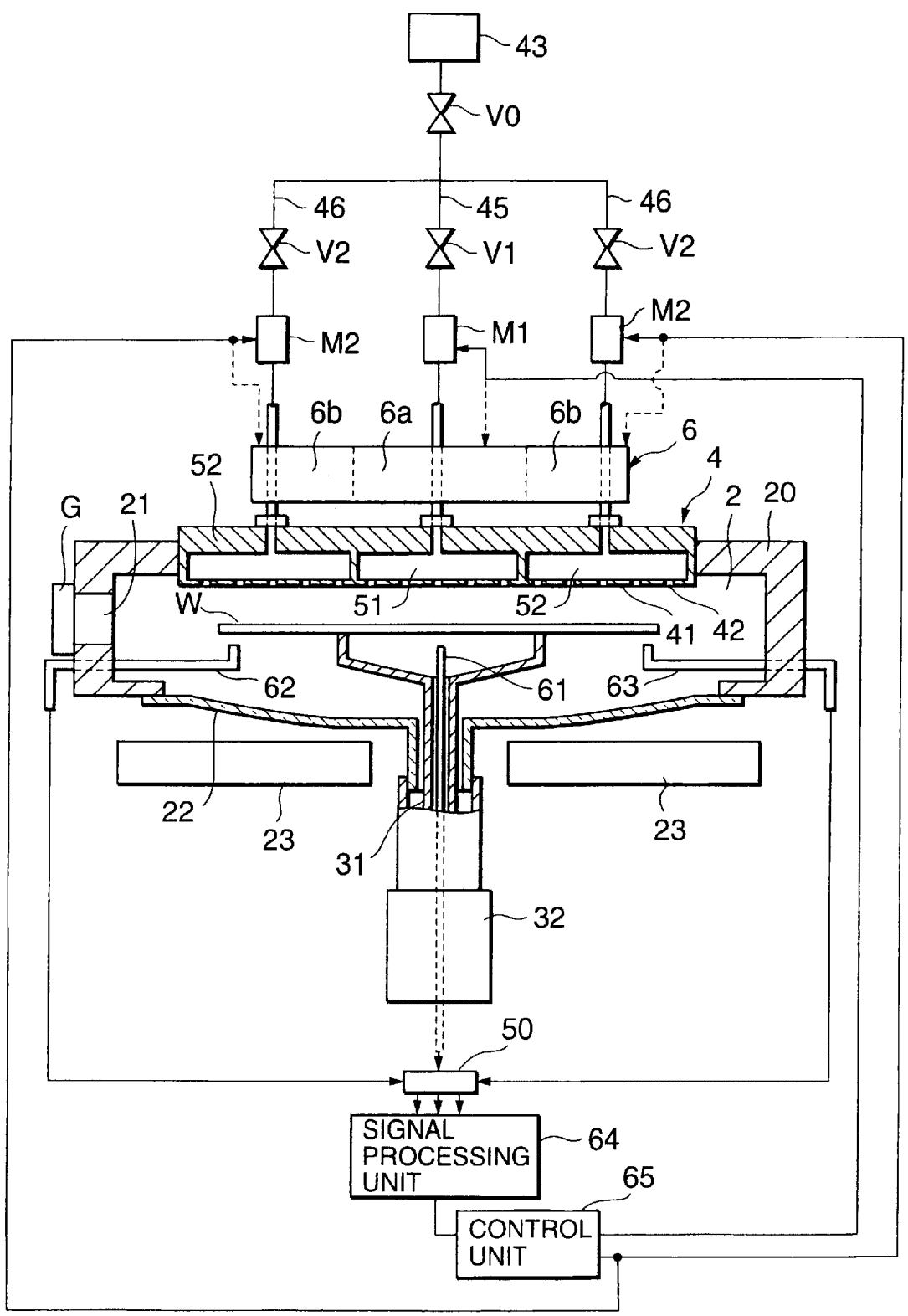
FIG. 7 is a vertical sectional view of a thermal treatment apparatus in a second embodiment of the present invention for carrying out a thermal treatment method according to the present invention.

A thermal treatment apparatus in a second embodiment of the present invention will be described with reference to FIG. 7. This thermal treatment apparatus supplies nitrogen gas of a temperature higher than that of a wafer W (hot gas) by a gas supply unit 4 when heating and cooling the wafer W. A gas source 43 is connected to the gas supply unit 4 via pipes 45 and 46. For example, a heating unit 6 is combined with parts of the branch pipes 45 and 46 immediately in front of the gas supply unit 4. Flow regulators M1 and M2 for regulating the flow rates of the gas flowing through the branch pipes 45 and 46 are placed in the branch pipes 45 and 46, respectively.

Optical fibers 61, 62 and 63 serving as components of a radiation thermometer are extended in a processing chamber 2 defined by a vessel 20 to measure the temperatures of a point in the central part of the wafer W and points in the peripheral part of the wafer W, respectively. The optical fiber 61 is extended through a shaft 31, and optical fibers 62 and 63 are extended through the side wall of the vessel 20. The optical fibers 61, 62 and 63 transmit radiation radiated from the back surface of the wafer W to a photoelectric converter 50. Electric signals generated by the photoelectric converter 50 are processed by a signal processing unit 64. The signal processing unit 64 determines a maximum temperature difference between the respective temperatures of the central part and the peripheral part of the wafer W on the basis of the electric signals given thereto, and gives a temperature difference signal representing the maximum temperature difference to a control unit 65. The control unit 65 reads data corresponding to the temperature difference from, for example, a table prepared beforehand, and controls the flow regulators M1 and M2 to control the respective flow rates of the hot gas supplied to the central part of the wafer W and the hot gas supplied to the peripheral part of the wafer W to increase the uniformity of temperature distribution in the surface of the wafer W.

Figure 8:
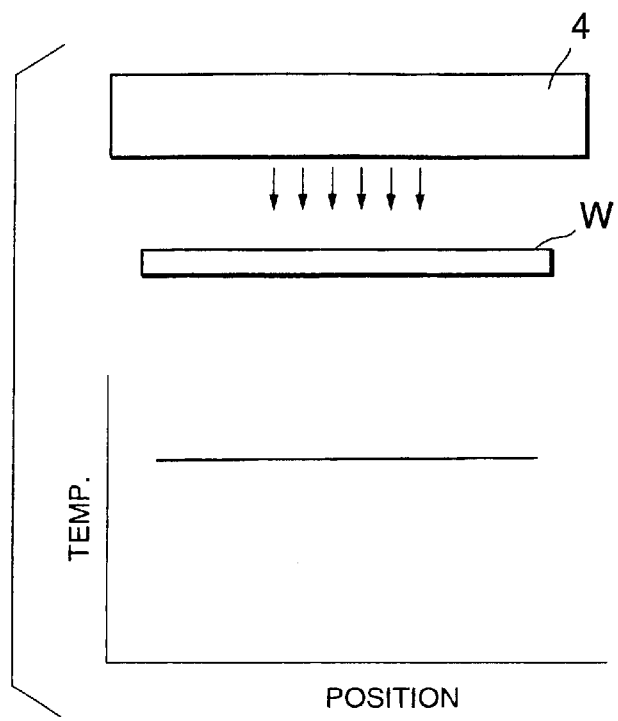
FIG. 8 is a view explaining the effect of supplying a hot gas to the central part of a wafer when raising the temperature of the wafer.
Figure 9:
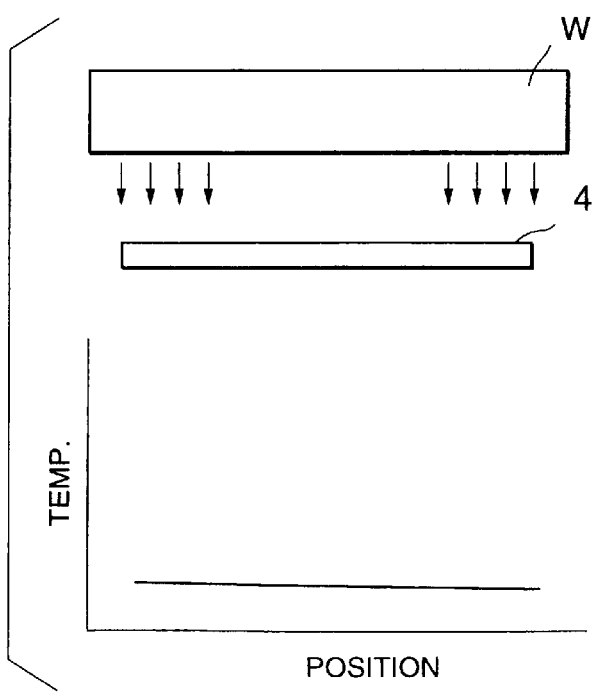
FIG. 9 is a view explaining the effect of supplying a hot gas to the peripheral part of a wafer when lowering the temperature of the wafer.

The hot gas is supplied only onto the central part of the wafer W as shown in FIG. 8, intra-surface temperature difference on the wafer W is measured and the flow regulator M1 is controlled so that the intra-surface temperature difference is reduced to zero when heating the wafer W. As shown in FIG. 9, when lowering the temerature, the hot gas is supplied only onto the peripheral part of the wafer W, while intra-surface temperature difference on the wafer W is measured and the flow regulators M2 are controlled so that the intra-surface temperature difference is reduced to zero.

The gas supply unit from which the nitrogen gas is supplied may be divided into three or more regions, temperature sensors may be arranged for the regions, respectively, and the flow rates of the gas for those regions may be controlled according to temperature signals provided by the temperature sensors. Furthermore, the heating unit 6 may be divided into heating sections 6a and 6b for the branch pipes 45 and 46 and the heating sections 6a and 6b may be individually controlled on the basis of signals provided by the control unit 65 instead of controlling the flow regulators M1 and M2. A gas supply system capable of supplying both a hot gas and a cool gas may be employed to supply the hot gas to the wafer W in a mode as mentioned in connection with the description of the embodiment when heating the wafer and to supply the cool gas to the wafer W in a mode as mentioned in connection with the description of the embodiment when cooling the wafer W.

Figure 3:
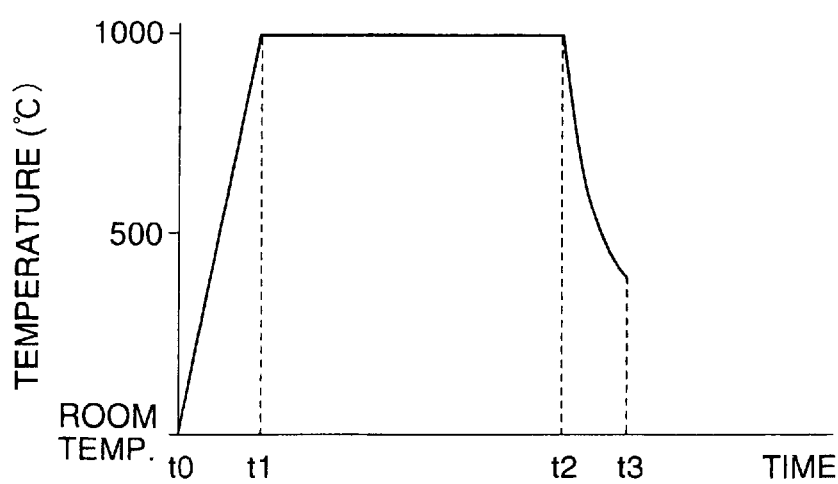
FIG. 3 is a graph showing a pattern of change of temperature of a wafer with time.

The present invention intends to adjust the temperature distribution in the surface of the wafer W by using the gas supplied by the gas supply unit 4 at least either during a temperature rising period or during a temperature falling period. Therefore, gases differing from each other in temperature or heat capacity may be supplied to the central part and the peripheral part, respectively, of the wafer W. For example, when heating (cooling) the wafer W, the temperature of the gas supplied to the central part may be higher (lower) than that of the gas supplied to the peripheral part or different kinds of gases may be supplied to the central part and the peripheral part so that the thermal capacity of the gas supplied to the central part is greater (smaller) than that of the gas supplied to the peripheral part. Gases respectively specified by different combinations of flow rate, temperature and thermal capacity may be supplied to the central part and the peripheral part. The method of enhancing the temperature distribution in the surface of the wafer W may be carried out only in the period between the times $t_1$ and $t_2$ (FIG. 3).

Figure 10:
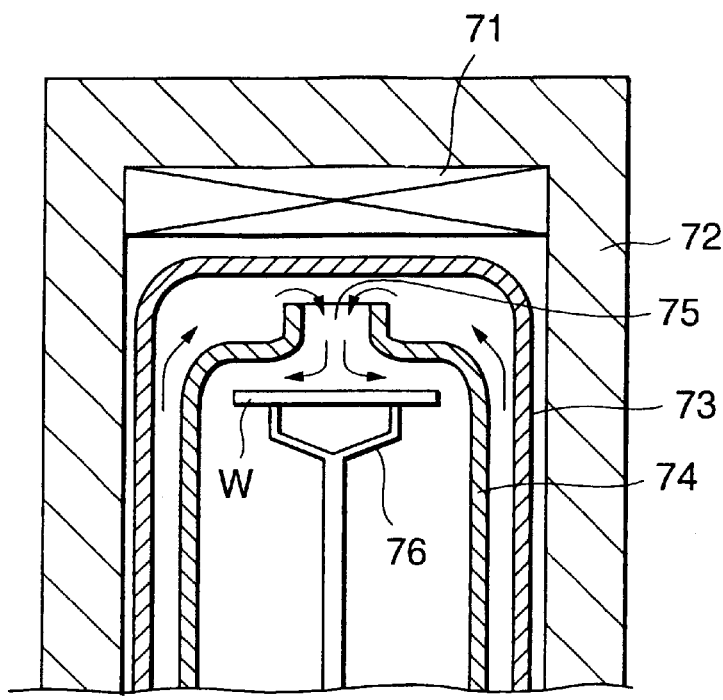
FIG. 10 is a vertical sectional view of an experimental apparatus used for verifying the effect of the present invention.

The following experiments were conducted by using an experimental apparatus shown in FIG. 10. The experimental apparatus has a furnace 72 provided with a heater 71 in its upper part, an outer tube 73 inserted in the furnace 71, a reaction tube 74 disposed in the outer tube 73, a gas supply pipe 75 connected to the upper end of the reaction tube 74, and a susceptor 76. Nitrogen gas is supplied through an annular space between the outer tube 73 and the reaction tube 74 and the gas supply pipe to a wafer W supported on the susceptor 76. Nitrogen gas was supplied through the gas supply pipe 75 at 5 SLM, 10 SLM, 15 SLM and 20 SLM while 6 in wafers W were heated from room temperature to 1100° C. at a temperature rising rate of 1000° C./min. Intra-surface temperature distributions in the surfaces of the wafers W were measured. The temperature was measured at five points in the surface of each wafer W, namely, a point at the center of the wafer and four points arranged at equal angular positions in the peripheral part of the wafer. The greatest one of temperature differences between the point at the center of the wafer and the four points in the peripheral part of the wafer was determined. The gas supply pipes respectively having inside diameters d of 14 mm, 60 mm and 86 mm were used. The wafer W was disposed substantially coaxially with the gas supply pipe 75.

Figure 11:
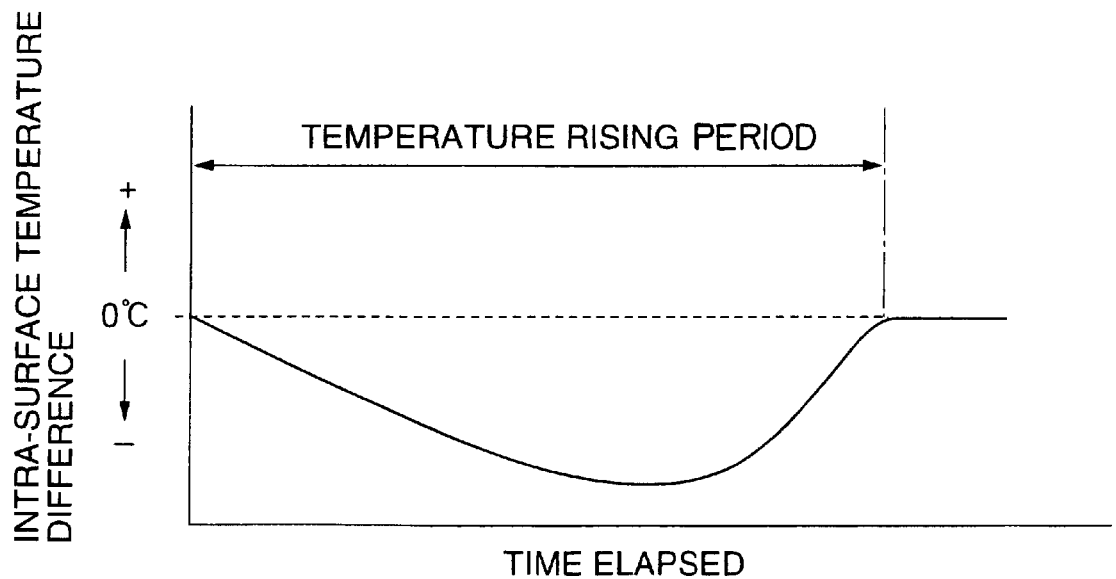
FIG. 11 is a graph showing the variation of intra-surface temperature difference with time.
Figure 12:
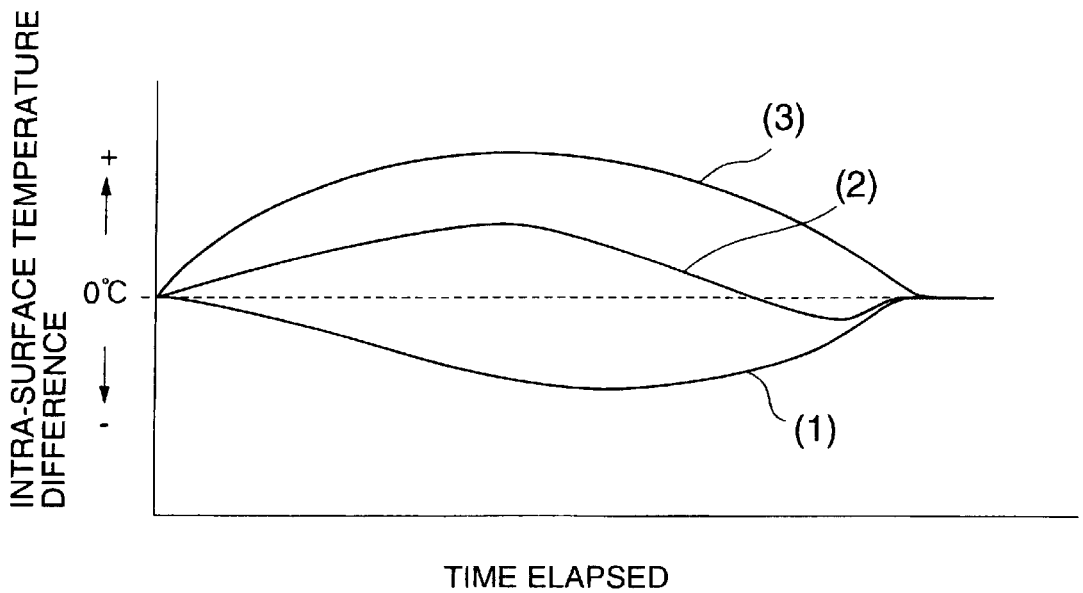
FIG. 12 is a graph showing the variation of intra-surface temperature difference with time when a gas is supplied by the experimental apparatus shown in FIG. 9.

FIG. 11 is a graph showing the variation of intra-surface temperature difference with time when a wafer W is conveyed into a processing chamber and is heated without supplying any gas onto the surface of the wafer during a temperature rising period. The intra-surface temperature difference is positive (+) when the temperature of the central part of the wafer W is higher than that of the peripheral part of the same and is negative (−) when the former is lower than the latter. It is observed from FIG. 11 that the temperature of the central part is always lower than that of the peripheral part. FIG. 12 is a graph showing the variation of intra-surface temperature difference with time when a gas is supplied onto a wafer at different flow rate (1), (2) and (3). The relation in magnitude between the flow rates (1), (2) and (3) is (1)<(2)<(3). FIGS. 11 and 12 showing experimental results are solely to demonstrate a typical tendency.

Figure 13:
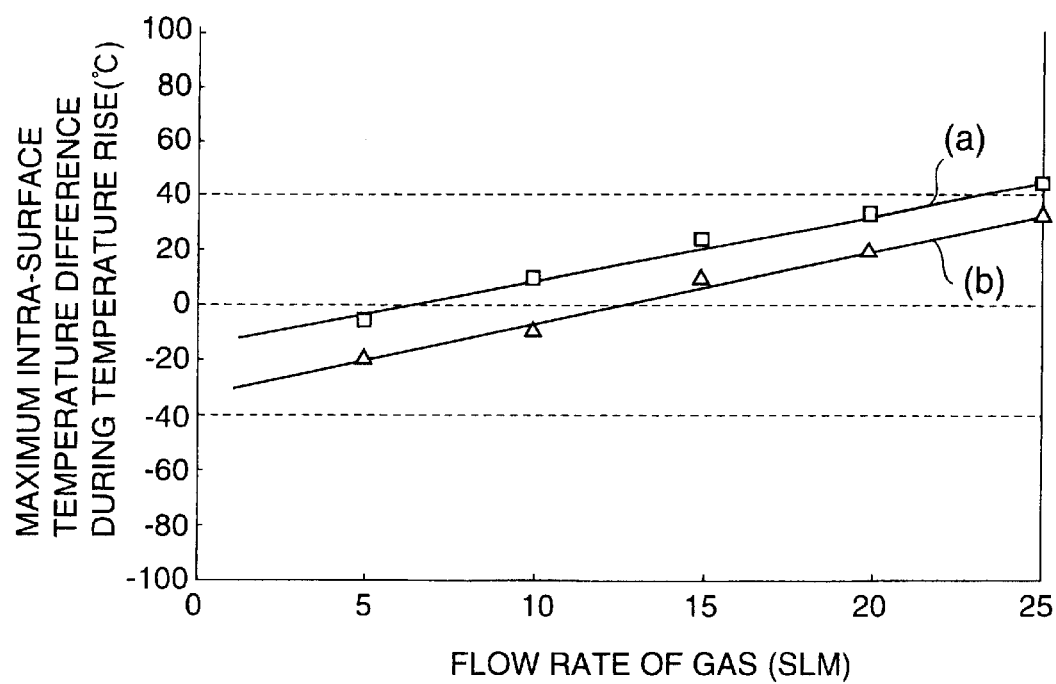
FIG. 13 is a graph showing the dependence of intra-surface temperature difference on the flow rate of a gas for the diameters of gas supply pipes determined by experiments conducted by using the experimental apparatus shown in FIG. 9.

FIG. 13 shows experimental results concretely. In FIG. 13, the vertical axis shows a maximum of temperature differences each determined by subtracting the temperature of one of the points in the peripheral part from that of the central part at each time, and the horizontal axis shows flow rate (SLM). In FIG. 13, curves (a) and (b) indicate data obtained when a gas supply pipe of 60 mm in inside diameter was used and when a gas supply pipe of 86 mm in inside diameter was used, respectively. For example, the temperature of the central part is higher by 20° C. than that of the peripheral part when the intra-surface temperature difference is 20° C., and the temperature of the peripheral part is higher by 20° C. than that of the central part when the intra-surface temperature difference is −20° C. As obvious from FIG. 13, the temperature of the peripheral part is higher than that of the central part when nitrogen gas is not supplied, i.e., when the flow rate of nitrogen gas is zero.

In the experimental apparatus shown in FIG. 10, the heater 71 is disposed above the gas supply pipe 75. Nitrogen gas that flows through the gas supply pipe 75 is a hot gas of a temperature higher than that of the wafer W. Therefore, the supply of the hot gas onto the central part of the wafer W quickens temperature rising in the central part. FIG. 13 shows that intra-surface temperature difference increases with the increase of gas flow rate, which signifies that the rate of rising of the temperature of the central part of the wafer W increases, the central part is heated at an excessively high temperature rising rate to increase the temperature of the central part beyond that of the peripheral part when the flow rate of the gas is excessively high and, consequently, intra-surface temperature difference increases. This tendency is dependent on the inside diameter of the gas supply pipe 75; the greater the inside diameter of the gas supply pipe 75, the smaller is the temperature difference determined by subtracting the temperature of the peripheral part from that of the central part when the flow rate is fixed.

Thus, it is known from the experimental results shown in FIG. 13 that the uniformity of temperature distribution in the surface of the wafer W can be improved by properly determining the respective sizes of the first gas chamber 51 and the second gas chamber 52 of the gas supply unit 4 shown in FIG. 1 and the respective flow rates of the gas supplied through the first gas chamber 51 and the gas supplied through the second gas chamber 52, and further by adjusting the temperature of the gas. Parts of the wafer to which the gas supply unit 4 supplies the gas in different gas supplying modes need not be necessarily the two parts, namely, the central part and the peripheral part; the wafer may be divided into three or more concentric parts (the gas chambers may be divided radially into three or more parts).

Figure 14:
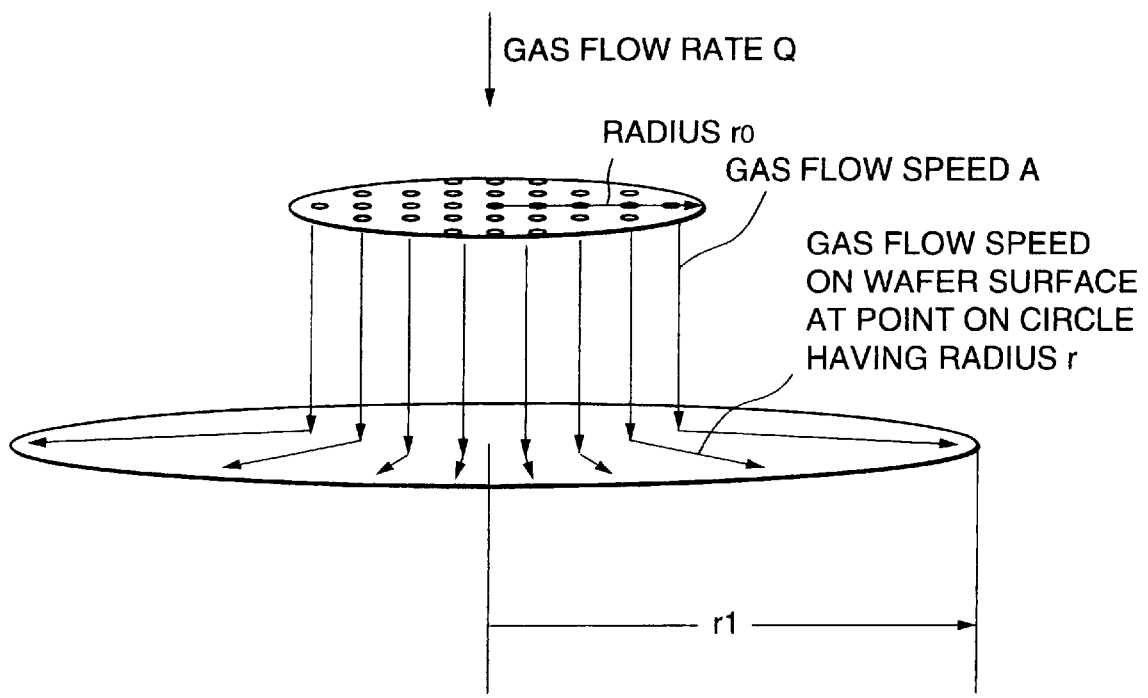
FIG. 14 is a diagrammatic view of a model for determining gas flow speed.

The effect of the arrangement of the gas supply holes 42 as shown in FIG. 2 will be explained hereafter. Suppose that the radius of an effective region in the gas supply plate 41, i.e., a region used for supplying the gas, is $r_0$, the radius of the wafer is $r_1$ and $r_0 < r_1$. FIG. 14 shows a model of a system including the gas supply plate and the wafer. Suppose that the gas flows through the gas supply holes 42 at a flow speed A, and flows at a position on the surface of the wafer at a radial distance r from the center of the wafer at a flow speed B. The flow speed B is expressed by Expression (1).

$$B = A\pi r^2 / 2\pi r = A \cdot r / 2 \tag{1}$$

where $A\pi r^2$ is flow rate of the gas supplied onto the central part of the wafer at a position at a radial distance r from the center of the wafer, and $2\pi r$ is the unit sectional area of a narrow annular region at the radius r. When $r < r_0$, radial flow speed on the wafer increases in proportion to the radius r.

When $r > r_0$, the flow speed B is expressed by Expression (2) because the gas is not supplied to a region at a radial distance 4 and the flow speed decreases in inverse proportion to the radius 4.

$$B = A\pi r_0^2 / 2\pi r = (A \cdot r_0^2 / 2)(1/r) \tag{2}$$

If the intrasurface temperature difference is not very large, the heat transfer coefficient H of heat transfer from the gas radially flowing along the surface of the wafer at the fixed flow speed B to the wafer is expressed by Expression (3).

$$H = 0.332 \lambda \cdot P^{1/3} \cdot v^{-1/2} \cdot (B/r)^{1/2} \tag{3}$$

where λ is the heat conductivity of the gas, P is Prandtl number (ν/λ) and ν is the kinematic viscosity of the gas.

When Expression (1) is substituted into Expression (3), the heat transfer coefficient H is a constant. Therefore, all positions on the surface of the wafer are the same in thermal transfer coefficient and the wafer can be heated in a highly uniform temperature distribution when the wafer is annealed, for example, at 1000° C. by determining the values of r and r0 so as to meet $r < r_0$ when the sectional area of the gas supply holes 42 per unit area of the gas supply plate 42 is the same in all the regions of the surface of the gas supply plate 41 and the ratios each of the number of the gas supply holes 42 on each of the concentric circles to the circumference of the same circle are equal. To meet the condition: $r < r_0$, the size of the region of the surface of the gas supply plate 41 in which the gas supply holes 42 are arranged is substantially equal to or greater than the corresponding size of the wafer.

If the condition: $r > r_0$ is met when heating and/or cooling the wafer, the heat transfer coefficient decreases in inverse proportion to r and the central part of the wafer can be locally heated or cooled.

As is apparent from the foregoing description, according to the present invention, when processing a substrate, such as a wafer, for thermal treatment, the increase of the intra-surface temperature difference can be suppressed when heating and/or cooling the substrate.

What is claimed is:

1. A thermal treatment method comprising the steps of:
   mounting a substrate on a substrate support mount disposed in a processing chamber,
   raising a temperature of the substrate;
   thermally treating the substrate by supplying a gas from a gas supply unit to the substrate; and
   lowering the temperature of the substrate after completion of thermally treating the substrate;
   wherein the gas supplied from the gas supply unit is supplied at a temperature lower than that of the substrate onto a peripheral part of the substrate at a flow rate higher than that at which the same gas is supplied onto a central part of the substrate when raising the temperature of the substrate, to equalize an amount of heat absorbed by the central part and that of heat absorbed by the peripheral part.

2. The thermal treatment method according to claim 1, further comprising the step of supplying the gas from the gas supply unit onto a surface of the substrate in an area greater than the surface of the substrate.

3. A thermal treatment method comprising the steps of:

mounting a substrate on a substrate support mount disposed in a processing chamber;

raising a temperature of the substrate;

thermally treating the substrate by supplying a gas from a gas supply unit to the substrate; and lowering the temperature of the substrate after completion of thermally treating the substrate;

wherein the gas supplied from the gas supply unit is supplied at a temperature lower than that of the substrate onto a central part of the substrate at a flow rate higher than that at which the same gas is supplied onto a peripheral part of the substrate when lowering the temperature of the substrate, to equalize an amount of heat radiated from the central part and that of heat radiated from the peripheral part.

4. A thermal treatment method comprising the steps of:

mounting a substrate on a substrate support mount disposed in a processing chamber;

raising a temperature of the substrate;

thermally treating the substrate by supplying a gas from a gas supply unit to the substrate; and lowering the temperature of the substrate after completion of thermally treating the substrate;

wherein the gas supplied from the gas supply unit is supplied at a temperature higher than that of the substrate onto a central part of the substrate at a flow rate higher than that at which the same gas is supplied onto a peripheral part of the substrate when raising the temperature of the substrate, to equalize an amount of heat absorbed by the central part and that of heat absorbed by the peripheral part.

5. A thermal treatment method comprising the steps of:

mounting a substrate on a substrate support mount disposed in a processing chamber;

raising a temperature of the substrate;

thermally treating the substrate by supplying a gas from a gas supply unit to the substrate; and lowering the temperature of the substrate after completion of thermally treating the substrate;

wherein the gas supplied from the gas supply unit is supplied at a temperature higher than that of the substrate onto a peripheral part of the substrate at a flow rate higher than that at which the same gas is supplied onto a central part of the substrate when lowering the temperature of the substrate, to equalize an amount of heat radiated from the central part and that of heat radiated from the peripheral part.

6. A thermal treatment method comprising the steps of:

mounting a substrate on a substrate support mount disposed in a processing chamber;

raising a temperature of the substrate;

thermally treating the substrate by supplying a gas from a gas supply unit to the substrate; and lowering the temperature of the substrate after completion of thermally treating the substrate;

wherein the gas is supplied onto the central part at a temperature higher than that of the same gas supplied onto the peripheral part when raising the temperature of the substrate, to equalize an amount of heat absorbed by the central part and that of heat absorbed by the peripheral part.

7. A thermal treatment method comprising the steps of:

mounting a substrate on a substrate support mount disposed in a processing chamber;

raising a temperature of the substrate;

thermally treating the substrate by supplying a gas from a gas supply unit to the substrate; and lowering the temperature of the substrate after completion of thermally treating the substrate;

wherein the gas is supplied onto the central part at a temperature lower than that of the same gas supplied onto the peripheral part when lowering the temperature of the substrate, to equalize an amount of heat radiated from the central part and the amount of heat radiated from the peripheral part.

8. A thermal treatment method comprising the steps of:

mounting a substrate on a substrate support mount disposed in a processing chamber;

raising a temperature of the substrate;

thermally treating the substrate by supplying a gas from a gas supply unit to the substrate; and lowering the temperature of the substrate after completion of thermally treating the substrate;

wherein a gas having a heat capacity greater than that of a gas supplied onto the peripheral part is supplied onto the central part when raising the temperature of the substrate, to equalize an amount of heat absorbed by the central part and that of heat absorbed by the peripheral part.

9. A thermal treatment method comprising the steps of:

mounting a substrate on a substrate support mount disposed in a processing chamber;

raising a temperature of the substrate;

thermally treating the substrate by supplying a gas from a gas supply unit to the substrate; and lowering the temperature of the substrate after completion of thermally treating the substrate;

wherein a gas having a heat capacity smaller than that of a gas supplied onto the peripheral part is supplied onto the central part when lowering the temperature of the substrate, to equalize an amount of heat radiated from the central part and that of heat radiated from the peripheral part.

* * * * *